United States Patent
Dunn

(10) Patent No.: US 6,647,996 B2
(45) Date of Patent: Nov. 18, 2003

(54) METHOD OF DIFFUSING PRESSURIZED LIQUID

(75) Inventor: L. Brian Dunn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/359,507

(22) Filed: Feb. 5, 2003

(65) Prior Publication Data

US 2003/0116178 A1 Jun. 26, 2003

Related U.S. Application Data

(62) Division of application No. 09/353,742, filed on Jul. 14, 1999, now Pat. No. 6,539,963.

(51) Int. Cl.[7] .................................................. B08B 3/04
(52) U.S. Cl. ....................................... 134/25.4; 134/34
(58) Field of Search ................................ 134/155, 186, 134/198, 182, 902, 25.4, 34, 36

(56) References Cited

U.S. PATENT DOCUMENTS 2,489,485 A * 11/1949 Franklin
2,965,314 A 12/1960 Salomon (List continued on next page.)

FOREIGN PATENT DOCUMENTS

| JP | 58-66333 A | 4/1983 |
|----|----|----|
| JP | 1-265520 A | 10/1989 |
| JP | 3-64916 A | 3/1991 |
| JP | 4-56321 A | 2/1992 |
| JP | 4-99025 A | 3/1992 |
| JP | 4-207031 A | 7/1992 |
| JP | 5-20266 A | 8/1993 |
| JP | 6-349721 A | 12/1994 |

OTHER PUBLICATIONS

Harris Semiconductor, "Lexicon—B." (http://rel.semi.harris.com/docs/lexicon/B.htm), 4 pages, Mar. 2, 1999.
Harris Semiconductor, "Lexicon—C." (http://rel.semi.harris.com/docs/lexicon/B.htm), 8 pages, Apr. 17, 1999.
Harris Semiconductor, "Lexicon—E." (http://rel.semi.harris.com/docs/lexicon/E.htm), 3 pages, Apr. 17, 1999.
Harris Semiconductor, "Lexicon—I." (http://rel.semi.harris.com/docs/lexicon/I.htm), 3 pages, Apr. 17, 1999.
Harris Semiconductor, "Lexicon—P." (http://rel.semi.harris.com/docs/lexicon/P.htm), 5 pages, Feb. 25, 1999.
Harris Semiconductor, "Lexicon—S." (http://rel.semi.harris.com/docs/lexicon/S.htm), 10 pages, Apr. 17, 1999.
Harris Semiconductor, "Lexicon—W." (http://rel.semi.harris.com/docs/lexicon/W.htm), 1 pages, Mar. 2, 1999.

*Primary Examiner*—Frankie L. Stinson
(74) *Attorney, Agent, or Firm*—Knobbe, Martens, Olson & Bear, LLP

(57) ABSTRACT

The invention relates to a diffuser for wet processing systems involved in the manufacturing of semiconductor wafers. The diffuser includes a plenum section and a slitted section. Pressurized fluid from the plenum section is forced through the slitted section and across a plurality of wafers mounted in the wet processing system. One advantage is that by "diffusing" pressurized fluid through the slitted section, a generally uniform and/or laminar flow is achieved. Desirably, the diffuser provides a more reliable, and hence more cost-effective, technology for wet processing fabrication of semiconductor wafers.

53 Claims, 8 Drawing Sheets

U.S. PATENT DOCUMENTS

| | | | |
|---|---|---|---|
| 2,985,387 A | 5/1961 | Sprang, Jr. | |
| 3,412,740 A | 11/1968 | Binks | |
| 3,568,935 A | 3/1971 | Hoffman | |
| 4,635,666 A | 1/1987 | Daley et al. | |
| 4,722,355 A | 2/1988 | Moe et al. | |
| 4,846,202 A | 7/1989 | Kallweit | |
| 4,875,824 A | 10/1989 | Moe et al. | |
| 5,039,349 A | 8/1991 | Schoeppel | |
| 5,054,519 A | 10/1991 | Berman | |
| 5,082,518 A | 1/1992 | Molinaro | |
| 5,180,467 A | * 1/1993 | Cook et al. | |
| 5,236,515 A | 8/1993 | Ueno et al. | |
| 5,327,921 A | 7/1994 | Mokuo et al. | |
| 5,365,960 A | 11/1994 | Bran | |
| 5,474,616 A | 12/1995 | Hayami et al. | |
| 5,482,068 A | 1/1996 | Kitahara et al. | |
| 5,503,171 A | 4/1996 | Yokomizo et al. | |
| 5,595,602 A | 1/1997 | Harlan | |
| 5,614,264 A | 3/1997 | Himes | |
| 5,656,097 A | 8/1997 | Olesen et al. | |
| 5,776,296 A | 7/1998 | Matthews | |
| 5,779,816 A | 7/1998 | Trinh | |
| 5,788,304 A | 8/1998 | Korn et al. | |
| 5,845,660 A | 12/1998 | Shindo et al. | |
| 5,846,374 A | 12/1998 | Parab et al. | |
| 5,865,894 A | 2/1999 | Reynolds | |
| 5,875,804 A | 3/1999 | Tanaka et al. | |
| 5,919,520 A | 7/1999 | Tateyama et al. | |
| 5,992,431 A | 11/1999 | Weber et al. | |
| 6,119,367 A | 9/2000 | Kamikawa et al. | |
| 6,142,391 A | 11/2000 | Seyed-Yagoobi et al. | |

* cited by examiner

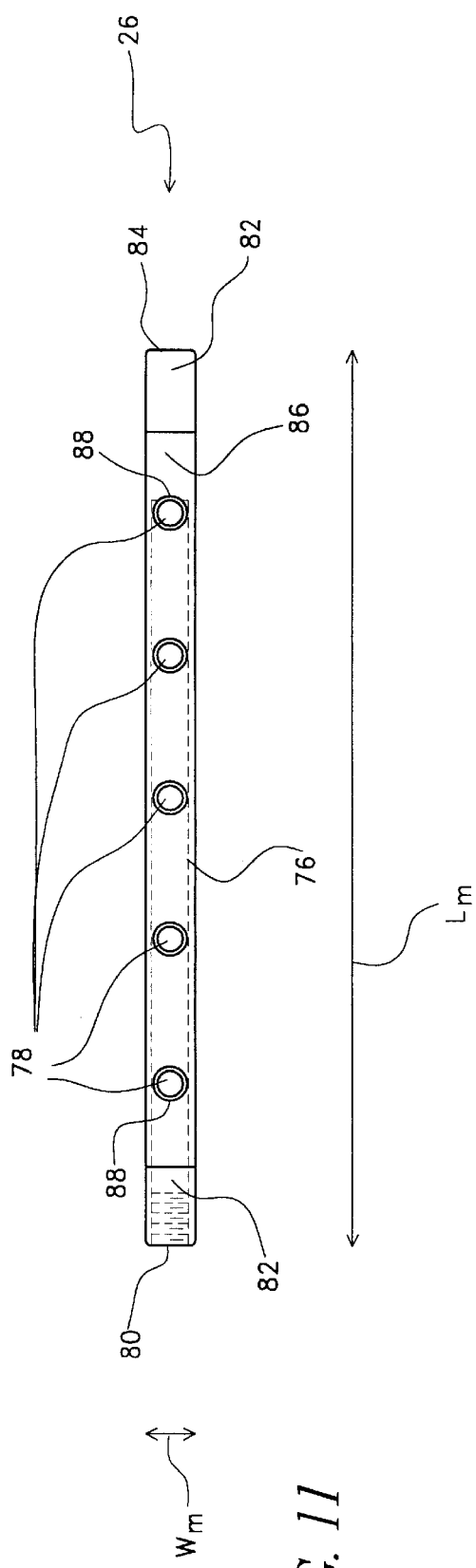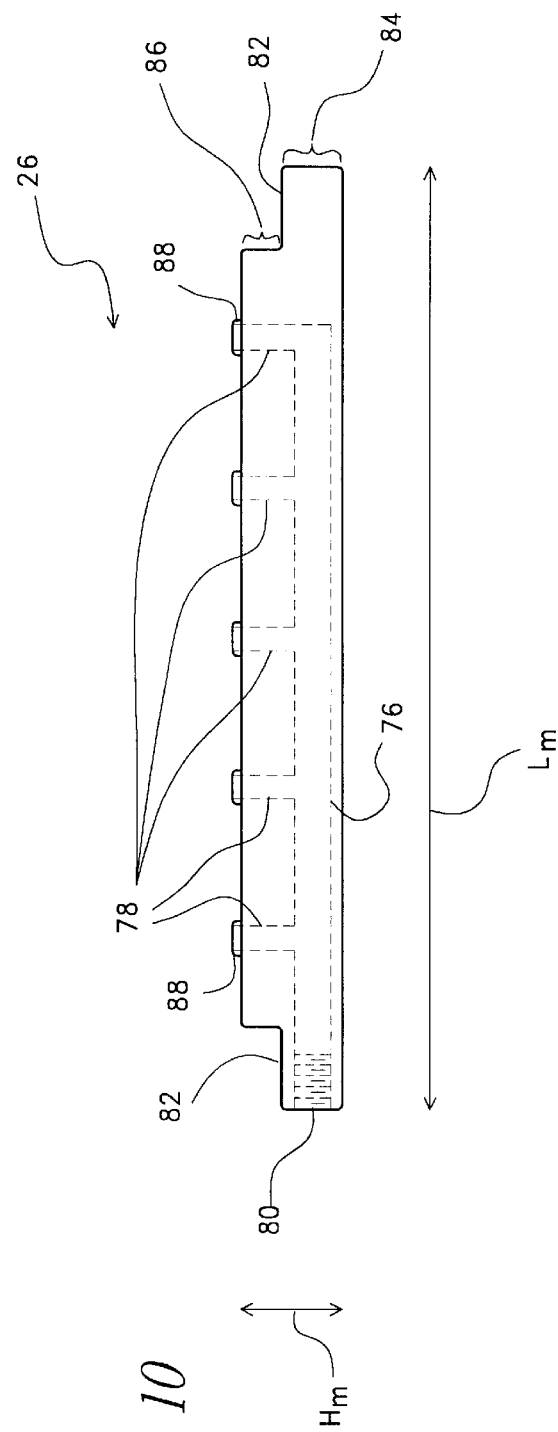

METHOD OF DIFFUSING PRESSURIZED LIQUID

RELATED APPLICATION(S)

This application is a divisional of U.S. application Ser. No. 09/353,742, filed Jul. 14, 1999 now U.S. Pat. No. 6,539,963, the entirety of which is hereby incorporated by reference herein.

BACKGROUND OF THE INVENTION

1. Field of the Invention

The present invention relates generally to semiconductor manufacturing and, specifically, to a pressurized diffuser in wet processing systems.

2. Background

Semiconductors are used in highly sophisticated equipment, such as computers and the like. Semiconductor chips or dies are typically batch fabricated on a silicon wafer. The wafer may contain hundreds of chips arranged in a matrix. The chips are separated by sawing the semiconductor wafer into small squares or rectangles. Each chip is then mounted on an appropriate substrate, contacted and packaged.

During the fabrication of semiconductor wafers, several process steps involve contacting the wafers with fluids. These include, for example, etching and rinsing of the wafers. The wafer surface is treated with the appropriate liquid(s) to create the desired etch pattern or to cleanse the wafer surface from contaminants. This wet processing generally utilizes a tank or bath in which one or more wafers are present. Typically, liquid flows over the wafer(s) and is either recirculated or drained.

It can be difficult to provide a uniform flow of liquid in wet processing systems. Uneven fluid flow can lead to unreliable results. For example, the etch pattern formed on the wafers may be unpredictable. Also, the wafers may not be thoroughly cleaned, and hence residual contaminants may remain on the wafer surface. The undesirable effects of this uneven fluid flow can be particularly severe as the end product devices become more miniaturized and complex.

SUMMARY OF THE INVENTION

The invention relates to a diffuser for wet processing systems involved in the manufacturing of semiconductor wafers. The diffuser includes a plenum section and a slitted section. Pressurized fluid from the plenum section is forced through the slitted section and across a plurality of wafers mounted in the wet processing system. One advantage is that by "diffusing" pressurized fluid through the slitted section a generally uniform and/or laminar flow is achieved. Desirably, the diffuser provides a more reliable, and hence more cost-effective, technology for wet processing fabrication of semiconductor wafers.

One embodiment of the invention relates to a wet semiconductor processing system. The wet semiconductor processing system comprises a plurality of wafers housed therein. The wet semiconductor processing system further comprises a diffuser in liquid communication with the wafers. The diffuser comprises a plurality of plenums adapted to receive a supply of fluid. The diffuser further comprises a plate in fluid communication with the plurality of plenums. The plate comprises a plurality of slits, whereby the slits provide a generally uniform flow across the wafers.

Another embodiment relates to a sparger for a wet processing system. The sparger comprises a surface with a plurality of slits formed therein, whereby fluid flow emanating through the surface is generally uniform. Yet another embodiment relates to a wet processing system. The wet processing system comprises a tank that houses a plurality of wafers. The wet processing system further comprises a diffuser positioned generally below the wafers. The diffuser comprises a slitted surface.

A further embodiment relates to a semiconductor processing apparatus which comprises a tank. The tank holds one or more wafers. The semiconductor processing apparatus further comprises a distributor positioned generally above the wafers wherein the distributor comprises a slotted plate.

One aspect of the invention relates to a method for diffusing fluid through a wafer processing system. The method comprises the acts of pressurizing fluid and forcing the fluid through a plurality of slits. The fluid emanating through the plurality of slits has a generally uniform flow pattern.

Another aspect of the invention relates to a method of manufacturing a diffuser for a semiconductor processing system. The method comprises the acts of forming a plurality of plenums in a first plate and forming a plurality of slits in a second plate. The method further comprises the act of attaching the first plate and the second plate so that the first plate and the second plate are in fluid communication.

Yet another aspect of the invention relates to a method for wet processing of wafers. The method comprises the acts of supporting one or more wafers in a tank and diffusing pressurized fluid through a plurality of slits, whereby a generally laminar flow is provided across the one or more wafers.

Another embodiment relates to a sparger. The sparger comprises a first section with a plurality of plenums adapted to receive a supply of fluid. The sparger further comprises a second section in communication with the first section. The second section includes a generally staggered slit pattern to pressurize the fluid within the first section. The slit pattern includes a plurality of rows of slits arranged in a repetitive alternating pattern with each row including one or more of the slits.

An additional embodiment of the invention relates to a pressurized liquid diffuser for a wet processing system. The diffuser comprises a plenum plate including five plenums for receiving a supply of liquid. The plenums are generally rectangular in shape and fabricated from polyvinylidene fluoride (PVDF). The diffuser further comprises a slitted plate in mechanical and fluid communication with the plenum plate. The slitted plate is configured to pressurize the liquid within the plenum plate. The slitted plate is generally rectangular in shape and includes fifty rows of slits. Each row includes at least three of the slits arranged and configured to form an alternating slit pattern between at least two of the rows.

For purposes of summarizing the invention, certain aspects, advantages and novel features of the invention have been described herein above. Of course, it is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 10 is a side elevational view of one of the manifolds of FIGS. 1 and 2; and FIG. 11 is a top plan view of the manifold of FIG. 10.

DETAILED DESCRIPTION OF THE PREFERRED EMBODIMENT

Figure 1:
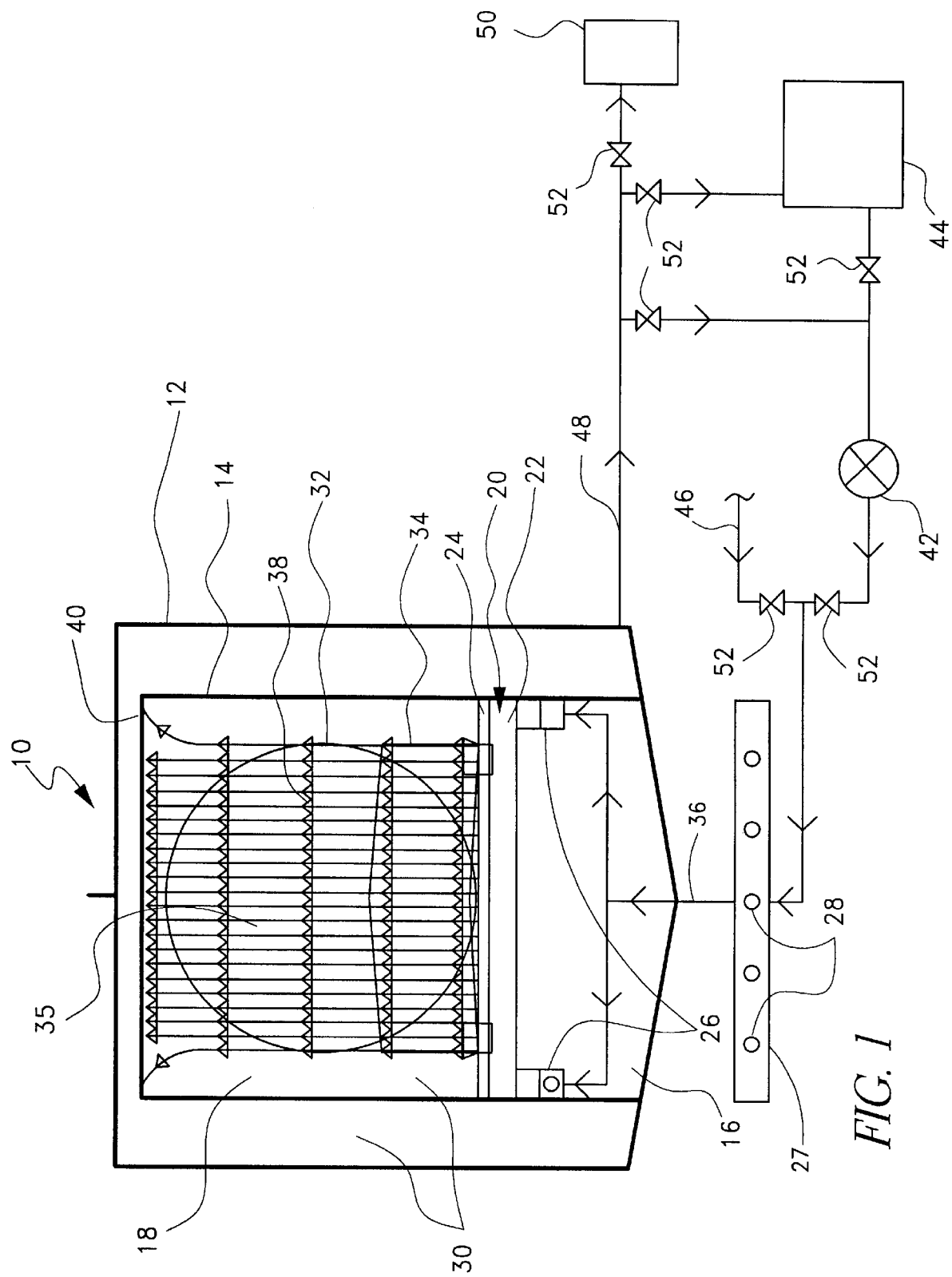
FIG. 1 is a schematic illustration of a wet processing system in accordance with one embodiment.

FIG. 1 is a schematic drawing of a wet semiconductor wafer processing system or apparatus 10 in accordance with one embodiment. The wet processing system 10 generally comprises an outer tank 12, and an inner tank or bath 14 with a lower chamber 16, and an upper chamber 18 separated by a fluid diffuser, sparger or distributor 20. The diffuser 20 includes a bottom plenum plate 22 and a top slitted plate 24, as discussed in greater detail later herein. In one embodiment, one or more manifolds 26 are in fluid communication with the plenum plate 22. The manifolds 26 are housed in the lower chamber 16. The skilled artisan will recognize that the lower chamber 16 can be excluded from the wet processing system 10, as required or desired.

The wet processing system 10 typically holds a fluid or liquid 30 and one or more wafers 32. In one embodiment, the wafers 32 reside in the upper chamber 18 of the inner tank 14 and are submerged in the fluid 30. A wafer carrier 34, residing in the upper chamber 18, is utilized to support the wafers 32. The wafer carrier 34 assists in aligning the wafers 32 with respect to the diffuser 20. In another embodiment, the wafers 32 may be supported directly in the inner tank 14 by suitable supporting rods (not shown).

The wafers 32 are held in a stationary position within the wet processing system 10. In one embodiment, the wafer carrier 34 positions the wafers 32 with their large flat sides 35 vertically oriented and spaced in generally parallel aligned relation. The wafer carrier 34 supports fifty wafers 32. The skilled artisan will recognize that the wet processing system 10 can be used in conjunction with fewer or more wafers 32.

With the inner tank 14 generally filled with fluid 30, a flow of fluid 30 is also provided to the inner tank 14 via an inlet feed line 36 connected to the manifolds 26. The fluid 30 flows through the manifolds 26, the plenum plate 22, the slitted plate 24 and in a generally upward direction over the wafers 32. As discussed in detail below, the diffuser 20 provides for a generally uniform and/or laminar flow pattern 38 over the wafers 32. The fluid 30 then flows over the upper rim 40 of the inner tank 14 and into the outer tank 12.

In one embodiment, a heating station 27 is provided upstream of the diffuser 20. The heating station 27 houses one or more heating elements or heaters 28. One or more of the heating elements 28 may be operated to control the temperature of the fluid 30, as required or desired. In other embodiments, a wide variety of other suitable fluid heating means can be used to heat the fluid 30 upstream or downstream of the diffuser 20, as required or desired.

In one embodiment, a pump 42 supplies fluid 30 from a reservoir or source 44 to the wet processing system 10 via the inlet feed line 36. In another embodiment, a pressurized facility supply line 46 provides fluid 30 to the wet processing system 10 via the inlet feed line 36. The fluid 30 exits the wet processing system 10 via an outlet feed line 48. The exiting fluid 30 is recirculated back into the wet processing system 10 using, for example, the pump 42. The exiting fluid 30 is transported to a drain or reservoir 50. Various shut-off valves 52 may be used to direct the flow of fluid 30 to and from the wet processing system 10, as required or desired. The skilled artisan will readily comprehend the operation of such valves 52.

The pump 42 can be a wide variety of commercially available pumps. In one embodiment, the pump 42 is an Air Drive Bellows, available from Iwaki. The skilled artisan will recognize that other types of pumps may be utilized with efficacy. In one embodiment, the pump 42 provides a flow rate of about 20 liters/min at a pressure of about 207 kilopascals (30 psi). In other embodiments, as the skilled artisan will recognize, a wide variety of operating flow rates and operating pressures can be used with efficacy, as required or desired.

The wet processing system 10 can be used in conjunction with a wide variety of steps involved in the fabrication of semiconductor wafers. These include, for example, etching, cleaning and rinsing of the wafers 32. The fluid 30 may comprise a wide variety of liquids. These liquids include, but are not limited to, deionized (DI) water, dilute hydrofluoric acid (DHF), "Piranha" (a solution typically comprising of sulfuric acid and hydrogen peroxide), sulfuric acid, phosphoric acid, nitric acid, hydrochloric acid, ammonium hydroxide, hydrogen peroxide, and isopropyl alcohol, among others. The skilled artisan will recognize that, in general, the wet processing system 10 can be used for any processing step in which a fluid flows across the wafers 32.

The outer tank 12 has a depth of about 33 cm, a width of about 33 cm, and a length of about 50 cm. The inner tank 14 has a depth of about 27 cm, a width of about 25 cm, and a length of about 42 cm. The lower chamber 16 has a depth of about 9 cm, a width of about 25 cm, and a length of about 42 cm. The upper chamber 18 has a depth of about 24 cm, a width of about 25 cm, and a length of about 42 cm. The inlet feed line 36 has an internal diameter of about 2 cm and the outlet feed line 48 has an internal diameter of about 2 cm. In other embodiments, as the skilled artisan will recognize, the outer tank 12, the inner tank 14, the lower chamber 16, the upper chamber 18, the inlet feed line 36, and the outlet feed line 48 may be dimensioned and configured in a wide variety of manners, as required or desired.

The outer tank 12, the inner tank 14, the lower chamber 16, the upper chamber 18, the inlet feed line 36, and the outlet feed line 48 may be fabricated from a wide variety of materials with efficacy, as is known in the art. The skilled artisan will recognize that the heating elements 28 can be a wide variety of commercially available fluid heaters.

The wet processing system 10 can be used in conjunction with a wide variety of wafers 32. In one embodiment, the wafers 32 comprise silicon. In other embodiments, the wafers 32 may comprise other semiconductor materials, as required or desired. The wafers 32 have a thickness of about 725 microns ($\mu$m) and a diameter of about 20 cm. In other embodiments, the skilled artisan will recognize that the wafers 32 may be dimensioned and configured in a wide variety of manners, as required or desired.

The wafer carrier 34 can be one of a wide variety of wafer carriers as are known in the art. In one embodiment, a wafer carrier 34 as disclosed in U.S. Pat. No. 5,788,304, incorporated herein by reference, is utilized. In other embodiments, the skilled artisan will recognize that other wafer carriers may be used, as required or desired, giving due consideration to the goal of providing support to the wafers 32.

Figure 2:
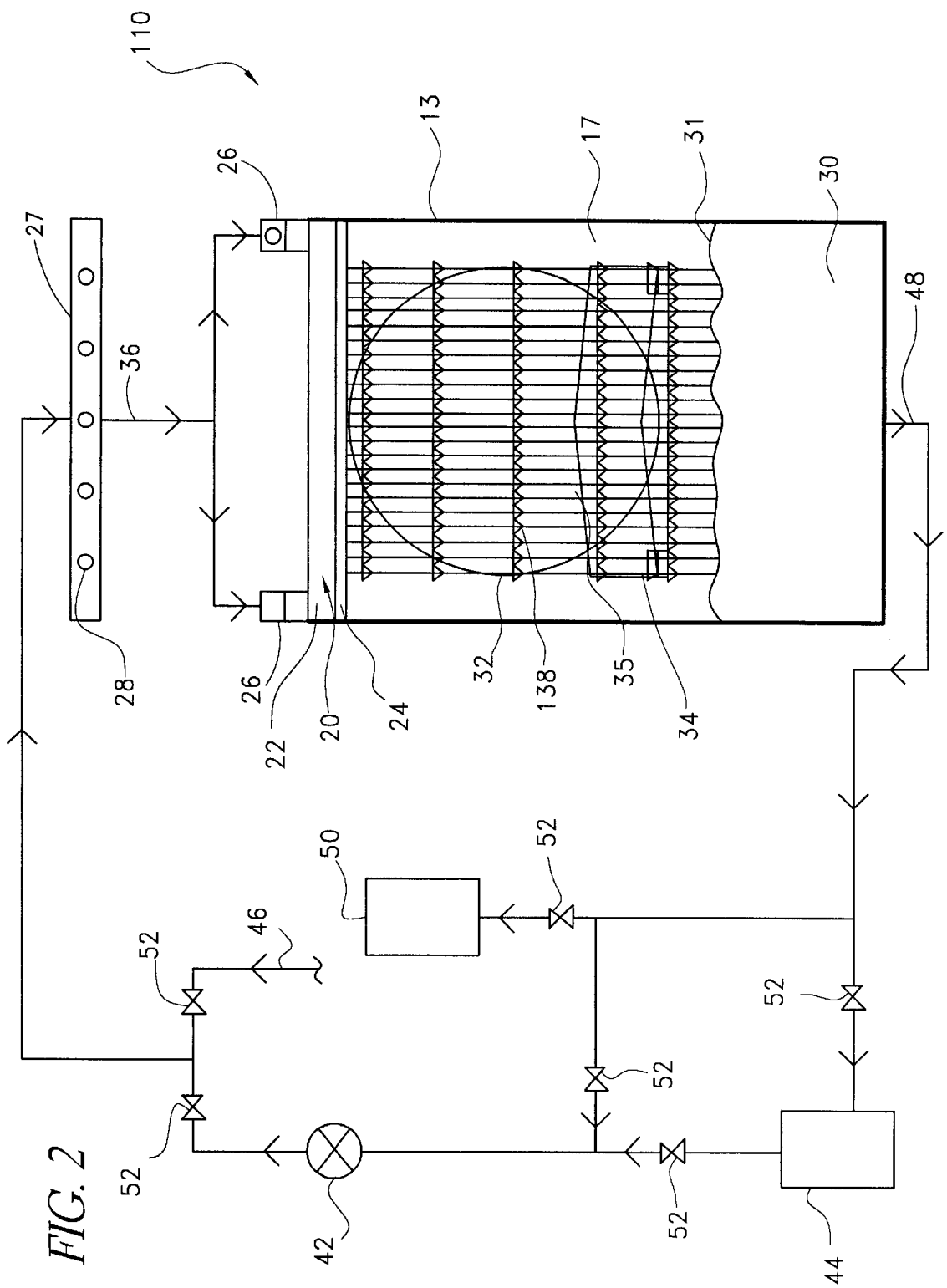
FIG. 2 is a schematic illustration of a wet processing system in accordance with another embodiment.

FIG. 2 is a schematic drawing of a wet semiconductor wafer processing system or apparatus 110 in accordance with one embodiment. The wet processing system 110 generally comprises a tank or bath 13 with a chamber 17, and a fluid diffuser, sparger or distributor 20 at the top end of the tank 13. The diffuser 20 includes a top plenum plate 22 and a bottom slitted plate 24, as discussed in greater detail later herein. In one embodiment, one or more manifolds 26 are in fluid communication with the plenum plate 22. The tank 13 can also include an additional upper chamber for housing the manifolds 26. In one embodiment, an outer tank with a lid can house the tank 13 and the diffuser 20 can be mounted on the outer tank lid.

The wet processing system 10 typically holds a fluid or liquid 30 and one or more wafers 32. In one embodiment, the wafers 32 reside in the chamber 17 of the tank 13 and are substantially adjacent to the diffuser 20 so that the fluid level 31 in the chamber 17 is below the wafers 32. A wafer carrier 34, residing in the chamber 17, is utilized to support the wafers 32. The wafer carrier 34 assists in aligning the wafers 32 with respect to the diffuser 20. In another embodiment, the wafers 32 may be supported directly in the tank 13 by suitable supporting rods (not shown).

The wafers 32 are held in a stationary position within the wet processing system 110. In one embodiment, the wafer carrier 34 positions the wafers 32 with their large flat sides 35 vertically oriented and spaced in generally parallel aligned relation. The skilled artisan will recognize that the wet processing system 110 can be used in conjunction with fewer or more wafers 32.

A flow of fluid 30 is provided to the tank 13 via an inlet feed line 36 connected to the manifolds 26. The fluid 30 flows through the manifolds 26, the plenum plate 22, the slitted plate 24 and in a generally downward direction over the wafers 32. As discussed in detail below, the diffuser 20 provides for a generally uniform and/or laminar flow pattern 138 over the wafers 32, and operates akin to a "showerhead." As indicated above, the fluid level 31 in the chamber 17 is below the wafers 32 so that the chamber 17 is partially devoid of fluid 30.

In one embodiment, a heating station 27 is provided upstream of the diffuser 20. The heating station 27 houses one or more heating elements or heaters 28. One or more of the heating elements 28 may be operated to control the temperature of the fluid 30, as required or desired. In other embodiments, a wide variety of other suitable fluid heating means can be used to heat the fluid 30 upstream or downstream of the diffuser 20, as required or desired.

In one embodiment, a pump 42 supplies fluid 30 from a reservoir or source 44 to the wet processing system 110 via the inlet feed line 36. In another embodiment, a pressurized facility supply line 46 provides fluid 30 to the wet processing system 110 via the inlet feed line 36. The fluid 30 exits the wet processing system 110 via an outlet feed line 48. The exiting fluid 30 is recirculated back into the wet processing system 110 using, for example, the pump 42, and the exiting fluid 30 is transported to a drain or reservoir 50. Various shut-off valves 52 may be used to direct the flow of fluid 30 to and from the wet processing system 110, as required or desired. The skilled artisan will readily comprehend the operation of such valves 52.

Diffuser

Figure 3:
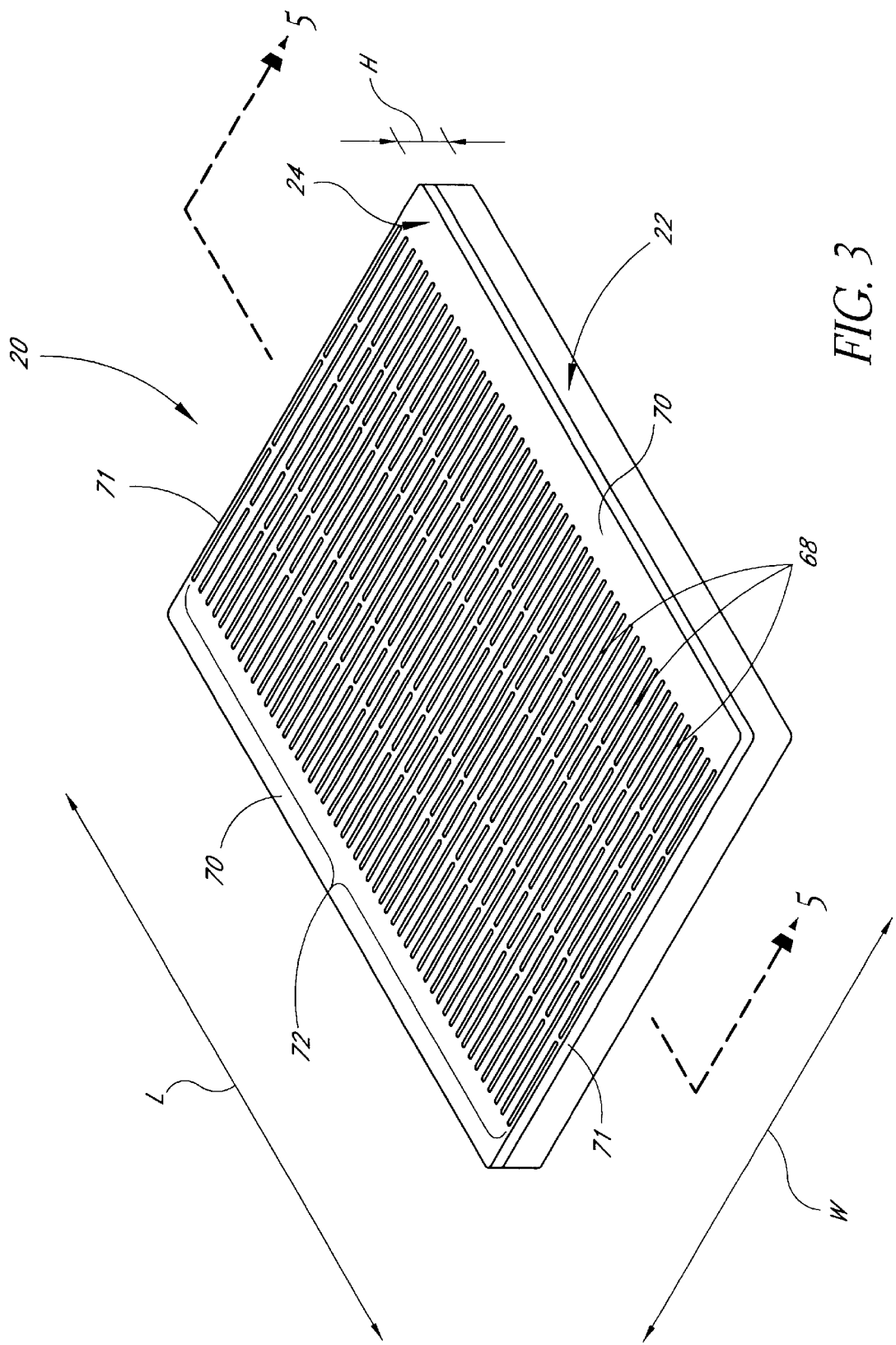
FIG. 3 is a perspective view of the diffuser of FIGS. 1 and 2.
Figure 4:
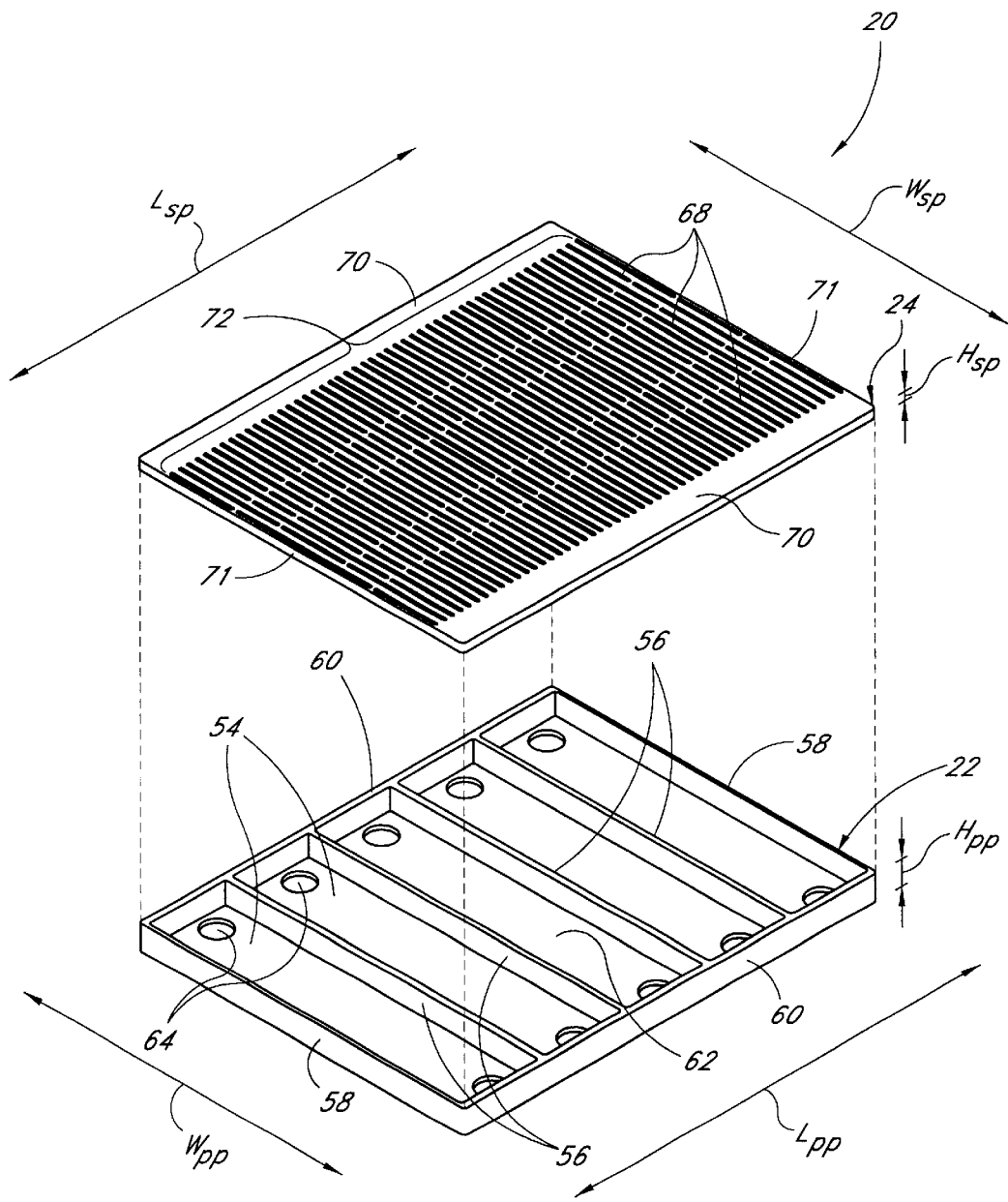
FIG. 4 is an exploded perspective view of the diffuser of FIG. 3.
Figure 5:
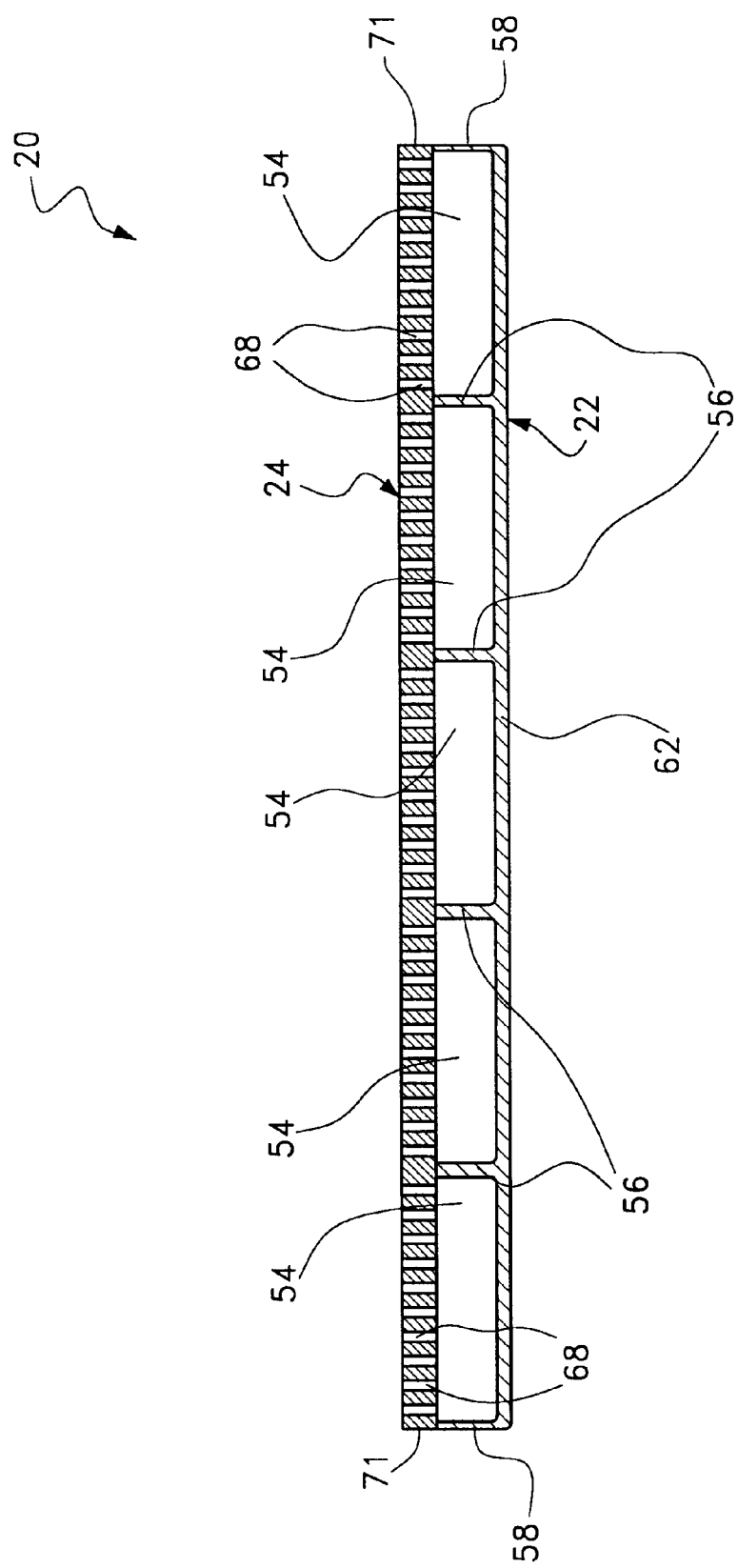
FIG. 5 is a cross-sectional along line 5—5 of FIG. 3.
Figure 6:
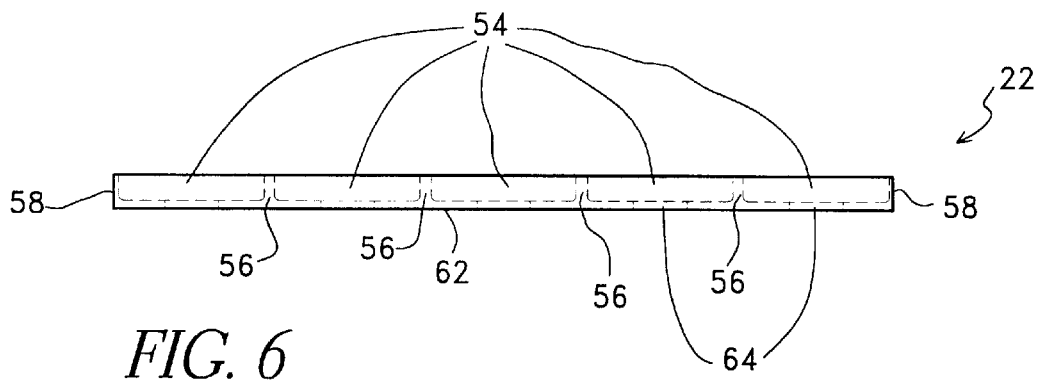
FIG. 6 is a side elevational view of the diffuser plenum plate of FIG. 3.
Figure 7:
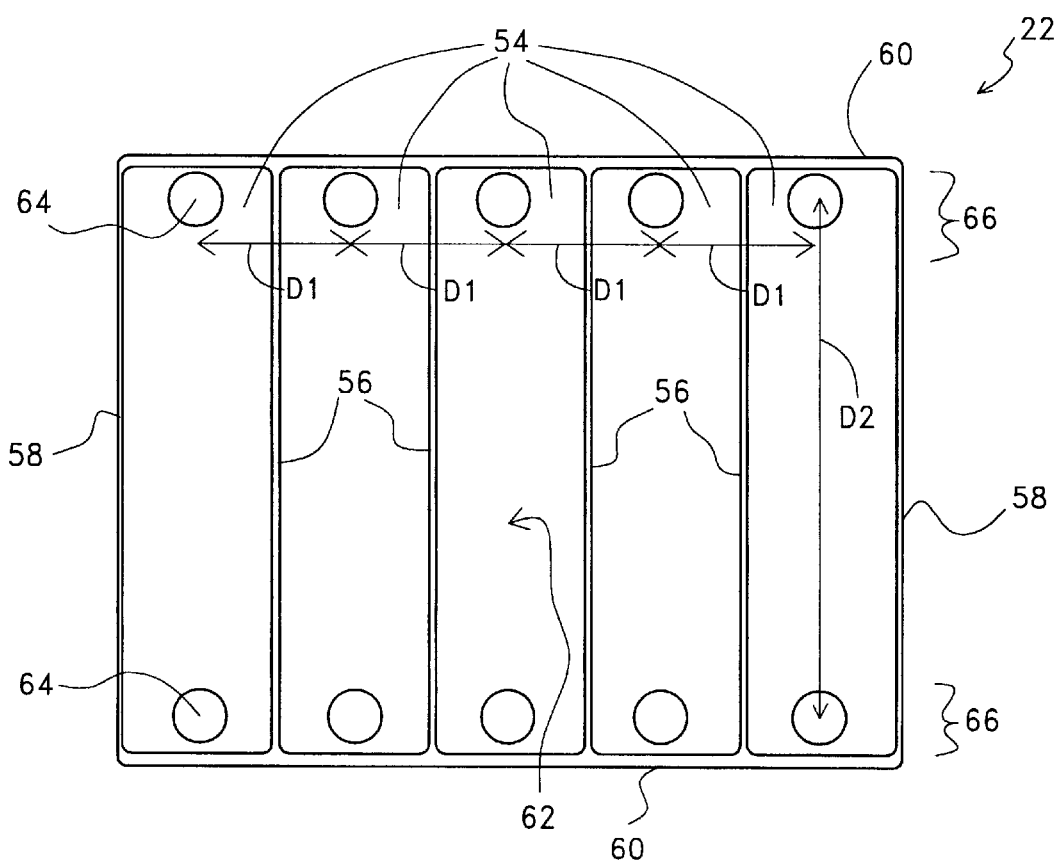
FIG. 7 is a top plan view of the diffuser plenum plate of FIG. 3.
Figure 8:
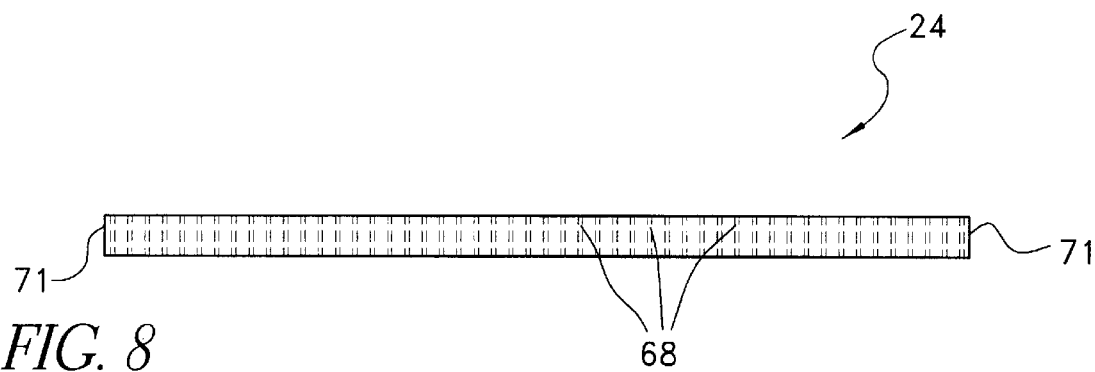
FIG. 8 is a side elevational view of the diffuser slitted plate of FIG. 3.

FIGS. 3 to 5 illustrate the diffuser, sparger or distributor 20 of FIGS. 1 and 2. As indicated above, the diffuser 20 comprises a first plenum plate or section 22 and a second slitted plate, section or surface 24. The plenum plate 22 and the slitted plate 24 are in mechanical communication with one another and are substantially aligned with one another, as discussed in further detail below. The diffuser 20 is adapted to be mounted in the wet processing system 10 (FIG. 1) and/or the wet processing system 110 (FIG. 2).

The diffuser 20 is fabricated from polyvinylidene fluoride (PVDF). In another embodiment, the diffuser 20 is fabricated from quartz. In other embodiments, the skilled artisan will recognize that the diffuser 20 can be fabricated from a wide variety of other suitable materials, with efficacy.

In one embodiment, the plenum plate 22 and the slitted plate 24 are manufactured separately, and then attached to one another to form the diffuser 20. For example, the plenum plate 22 and the slitted plate 24 may be formed by machining or laser cutting and then attached by utilizing welding or bonding. In another embodiment, the diffuser 20, comprising the plenum plate 22 and the slitted plate 24, may be manufactured as a unitary element. In other embodiments, the diffuser 20 can be fabricated by a variety of other methods, for example, molding, casting, and forging, among others.

Referring in particular to FIG. 3, in one embodiment, the diffuser 20 has a height (H) of about 2.54 cm (1.00 inches), a width (W) of about 24.77 cm (9.75 inches), and a length (L) of about 31.59 cm (12.44 inches). In another embodiment, the diffuser 20 has a height (H) in the range from about 1 cm to 25 cm, a width (W) in the range from about 10 cm to 40 cm, and a length (L) in the range from about 1 cm to 50 cm. In other embodiments, the skilled artisan will recognize that the diffuser 20 may be dimensioned and configured in a wide variety of manners, as required or desired.

Plenum Plate

Referring in particular to FIGS. 3 to 7, the plenum plate 22 includes a plurality of plenums, chambers or receptacles 54. In one embodiment, the plenum plate 22 includes five plenums 54. In other embodiments, the plenum plate 22 may include fewer or more plenums 54, as required or desired. The plenums 54 are generally rectangular in shape, though the skilled artisan will readily recognize that other shapes may be utilized with efficacy. In one embodiment, the plenum plate 22 includes cross walls 56, end walls 58, and side walls 60 in communication with a base plate or section 62 to define the plenums 54.

The base section 62 of the plenum plate 22 includes a plurality of openings 64. In one embodiment, the openings 64 are positioned substantially adjacent to the side walls 60. As discussed in greater detail later herein, the openings 64 interface with the manifolds 26 (FIGS. 1 and 2). In one embodiment, the base section 62 includes ten openings 64 with two openings 64 being associated with each one of five plenums 54 to form two groups 66 of openings 64. In other embodiments, as the skilled artisan will recognize, the base section 62 may include fewer or more openings 64, and the distribution and positioning of the openings 64 among the plenums 54 may be varied, as required or desired.

In one embodiment, the plenum plate 22 is fabricated from polyvinylidene fluoride (PVDF). In another embodiment, the plenum plate 22 is fabricated from quartz. In other embodiments, the skilled artisan will recognize that the plenum plate 22 can be fabricated from a wide variety of other suitable materials, with efficacy.

The plenum plate 22 is fabricated by machining. In another embodiment, the plenum plate 22 is fabricated by laser cutting. In other embodiments, as the skilled artisan will recognize, the plenum plate 22 can be fabricated by a wide variety of other methods, for example, molding, casting and forging, among others. Also, one or more of the plenums 54 may be fabricated separately, and then combined with one or more plenums 54 to form the plenum plate 22.

Referring in particular to FIG. 4, in one embodiment, the plenum plate 22 has a height ($H_{pp}$) of about 1.91 cm (0.75 inches), a width ($W_{pp}$) of about 24.77 cm (9.75 inches), and a length ($L_{pp}$) of about 31.59 cm (12.44 inches). In other embodiments, the skilled artisan will recognize that the plenum plate 22 may be dimensioned and configured in a wide variety of manners, as required or desired.

The plenums 54 have a height of about 1.588 cm (0.625 inches), a width of about 23.81 cm (9.375 inches), and a length of about 5.842 cm (2.30 inches). The cross walls 56 have a thickness of about 0.4763 cm (0.1875 inches). The end walls 58 have a thickness of about 0.2381 cm (0.09375 inches). The side walls 60 have a thickness of about 0.4763 cm (0.1875 inches). The base plate 62 has a thickness of about 0.3175 cm (0.125 inches). The openings 64 have a diameter of about 1.27 cm (0.5 inches). Neighboring openings 64 of an opening group 66 are spaced by a distance (D1), labeled in FIG. 7, of about 5.874 cm (2.313 inches) from one another. The openings 64 associated with the same plenum 54 are spaced by a distance (D2), labeled in FIG. 7, of about 23 cm from one another. In other embodiments, the skilled artisan will recognize that the plenums 54, the cross walls 56, the end walls 58, the side walls 60, the base plate 62, and the openings 64 may be dimensioned and configured in a wide variety of manners, as required or desired.

Slitted Plate

Referring in particular to FIGS. 3 to 5 and 8 to 9, the slitted or slotted plate 24 includes a plurality of slits or slots 68. In one embodiment, the slitted plate 24 has side rails 70 and end edges 71 which border the slits 68. In one embodiment, the slitted plate 24 is generally rectangular in shape, though as the skilled artisan will recognize, other shapes may be utilized with efficacy, as required or desired.

The slitted plate 24 includes a staggered pattern 72 of slits 68. The slitted plate 24 includes a plurality of rows 74 of slits 68. In one embodiment, the rows 74 are spaced such that an individual one of the wafers 32 (FIGS. 1 and 2) can be positioned near a respective row 74 without blocking the slits 68 in adjacent rows 74. The rows 74 are also spaced such that they provide enough spacing between adjacent wafers 32. Thus, the wafers 32 have a generally insignificant effect on the flow pattern across neighboring wafers 32.

In one embodiment, the slitted plate 24 includes fifty rows 74 of slits 68 which can be used in conjunction with up to fifty wafers 32 (FIGS. 1 and 2). In other embodiments, as the skilled artisan will recognize, the slitted plate 24 can include fewer or more rows 74 of slits 68, as required or desired. Each row 74 of slits 68 includes three slits 68. In other embodiments, as the skilled artisan will recognize, the slitted plate 24 can include fewer or more slits 68 in each row 74, as required or desired, based on providing generally uniform and/or laminar flow and preserving the structural integrity of the slitted plate 24.

The slits 68 are dimensioned, configured and patterned to pressurize the fluid 30 within the plenum plate 22 to a selected pressure value or range. Thus, as fluid 30 is forced through the slits 68 it emanates in a generally uniform and/or laminar flow pattern 38 (FIG. 1), 138 (FIG. 2). In other embodiments, the slits 68 may be dimensioned and configured in a wide variety of ways, as required or desired, giving due consideration to the goal of providing generally uniform and/or laminar flow.

The slit pattern 72 includes a repetitive alternating pattern of rows 74. This is illustrated by referring to FIG. 9 which shows rows 74a and 74b. In one embodiment, rows 74a include three slits 68 with a shorter central slit 68a between two longer end slits 68b. The rows 74b include three slits 68 with a longer central slit 68a' between two shorter end slits 68b'. The row 74a is neighbored by row(s) 74b and occurs alternately in the slit pattern 72. The row 74b is neighbored by row(s) 74a and occurs alternately in the slit pattern 72.

In one embodiment, the slitted plate 24 is fabricated from polyvinylidene fluoride (PVDF). In another embodiment, the slitted plate 24 is fabricated from quartz. In other embodiments, the skilled artisan will recognize that the slitted plate 24 can be fabricated from a wide variety of other suitable materials, with efficacy.

The slitted plate 24 is fabricated by machining. In another embodiment, the slitted plate 24 is fabricated by laser cutting. In other embodiments, as the skilled artisan will recognize, the slitted plate 24 can be fabricated by a wide variety of other methods, for example, molding, casting and forging, among others. Also, the slitted plate 24 may be fabricated in sections which can then be combined to form the slitted plate 24.

In one embodiment, the slitted plate 24 has a height ($H_{sp}$) of about 0.635 cm (0.25 inches), a width ($W_{sp}$) of about 24.77 cm (9.75 inches), and a length ($L_{sp}$) of about 31.59 cm (12.44 inches). In other embodiments, the skilled artisan will recognize that the slitted plate 24 may be dimensioned and configured in a wide variety of manners, as required or desired. As indicated above, the slitted plate 24 is dimensioned, configured and patterned with slits 68 to pressurize the fluid 30 within the plenum plate 22 to a selected pressure value or range. Thus, as fluid 30 is forced through the slits 68 it emanates in a generally uniform and/or laminar flow pattern 38 (FIG. 1), 138 (FIG. 2). In other embodiments, the slitted plate 24 may be dimensioned and configured in a wide variety of ways, as required or desired, giving due consideration to the goal of providing generally uniform and/or laminar flow.

The side rails 70 have a height of about 0.635 cm (0.25 inches), a width of about 2.204 cm (0.8676 inches), and a length of about 31.59 cm (12.44 inches). The end edges 71 are spaced from the center of respective adjacent slits 68 by a distance of about 0.2819 cm (0.111 inches). In other embodiments, the skilled artisan will recognize that the side rails 70 and end edges 71 may be dimensioned and spaced in a wide variety of manners, as required or desired.

The center-to-center spacing between adjacent slit rows 74 is about 0.635 cm (0.25 inches). As indicated above, the rows 74 are spaced such that an individual one of the wafers 32 (FIGS. 1 and 2) can be positioned near a respective row 74 without blocking the slits 68 in adjacent rows 74. The rows 74 are also spaced such that they provide enough spacing between adjacent wafers 32. Thus, the wafers 32 have a generally insignificant effect on the flow pattern across neighboring wafers 32. In other embodiments, the skilled artisan will recognize that the spacing between the rows 74 may be varied in a wide variety of manners, as required or desired.

The slits 68 have a depth of about 0.635 cm (0.25 inches). The slits 68 have a width in the range from about 0.0508 cm (0.02 inches) to 0.0762 cm (0.03 inches). The slits 68 have a length in the range from about 4.763 cm (1.875 inches) to 10.16 cm (4.0 inches). In other embodiments, the skilled artisan will recognize that the slits 68 may be dimensioned and configured in a wide variety of manners, as required or desired.

The spacing between adjacent slits 68 in a row 74, for example, adjacent slits 68a and 68b in row 74a, is about 0.3175 cm (0.125 inches). Similarly, in one embodiment, the spacing between adjacent slits 68 in a row 74, for example, adjacent slits 68a' and 68b' in row 74b, is about 0.3175 cm (0.125 inches). In other embodiments, the skilled artisan will recognize that the slits 68 may be dimensioned and configured in a wide variety of manners, as required or desired.

The slits 68a of rows 74a have a length of about 4.763 cm (1.875 inches) and slits 68b of rows 74a have a length of about 7.461 cm (2.938 inches). In one embodiment, slits 68a' of rows 74b have a length of about 10.16 cm (4.0 inches) and slits 68b' of rows 74b have a length of about 4.763 cm (1.875 inches). In other embodiments, the skilled artisan will recognize that the slits 68 and rows 74 may be dimensioned and configured in a wide variety of manners, as required or desired.

Figure 9:
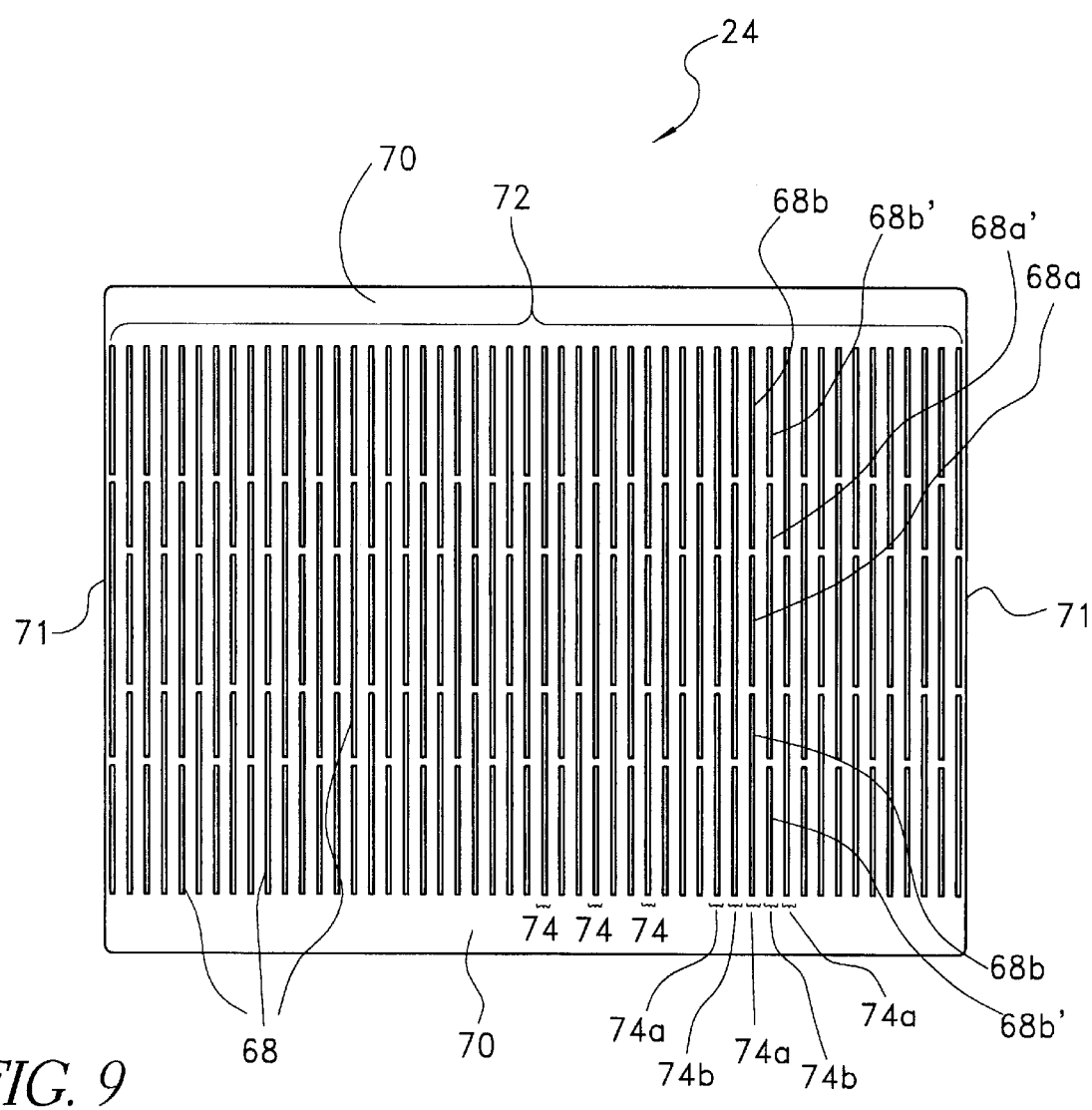
FIG. 9 is a top plan view of the diffuser slitted plate of FIG. 3.

Referring in particular to FIGS. 4 and 9, in one embodiment, ten rows 74 of slits 68 are in fluid communication with each plenum 54 of the plenum plate 22. In other embodiments, fewer or more rows 74 can be in fluid communication with each plenum 54, as required or desired, giving due consideration to the goals of providing generally uniform and/or laminar flow.

Manifolds

FIGS. 10 and 11 illustrate one of the manifolds 26 of FIGS. 1 and 2 in accordance with one embodiment. In one embodiment, the wet processing system 10 (FIG. 1) includes two manifolds 26. In other embodiments, the wet processing system 10 (FIG. 1) may include fewer or more manifolds 26, as required or desired, giving due consideration to the goals of providing generally uniform and/or laminar flow. In one embodiment, the wet processing system 110 (FIG. 2) includes two manifolds 26. In other embodiments, the wet processing system 110 (FIG. 2) may include fewer or more manifolds 26, as required or desired, giving due consideration to the goals of providing generally uniform and/or laminar flow.

The manifold 26 generally comprises a main supply rail 76 in fluid communication with a plurality of channels 78. In one embodiment, the manifold 26 includes five channels 78. In other embodiments, the manifold 26 can include fewer or more channels 78, as required or desired, giving due consideration to the goals of providing generally uniform and/or laminar flow.

A threaded opening 80 at one end of the manifold supply rail 76 permits fluid 30 to be fed into the manifold channels 78 from the inlet feed line 36 (FIGS. 1 and 2) utilizing suitable tubing and fittings. In other embodiments, the opening 80 may be located at other suitable positions on the manifold supply rail 76, as required or desired. In one embodiment, steps 82 are provided in the manifold 26 to generally define a first portion 84 and a second portion 86. The manifold first portion 84 generally includes the supply rail 76 and the manifold second portion 86 generally includes the channels 78.

The projections 88 are provided at the ends of the channels 78. These projections 88 are spaced, sized and configured to mate with the plenum plate openings 64 (shown, for example, in FIGS. 4 and 7). In one embodiment, the manifold projections 88 are attached to the plenum plate openings 64 by using welding or bonding. Also, the manifolds 26 are coupled to the plenum plate 22 by utilizing welding or bonding. In other embodiments, as the skilled artisan will recognize, the manifold 26 may be coupled to the plenum plate 22 by a wide variety of means, for example, by using suitable connectors and the like.

The skilled artisan will recognize that the manifold(s) 26 may be fabricated using a wide variety of materials, as required or desired. The manifold(s) 26 may be manufactured by utilizing a wide variety of manufacturing techniques with efficacy, as will be recognized by those skilled in the art.

Referring to FIGS. 10 and 11, in one embodiment, the manifold 26 has a height ($H_m$) of about 3.81 cm (1.5 inches), a width ($W_m$) of about 1.905 cm (0.75 inches), and a length ($L_m$) of about 36.67 cm (14.44 inches). In other embodiments, the skilled artisan will recognize that the manifold 26 may be dimensioned and configured in a wide variety of manners, as required or desired.

The supply rail 76 has a diameter of about 1.429 cm (0.5625 inches) and a length of about 30.56 cm (12.03 inches). The channels 78 have a diameter of about 0.9525 cm (0.375 inches). The spacing between adjacent channels 78 is about 5.874 cm (2.313 inches). The spacing between the outermost channels 78 and the lengthwise ends of the manifold 26 is about 6.588 cm (2.594 inches). The projections 88 have a diameter of about 0.9525 cm (0.375 inches), an outer diameter of about 1.27 cm (0.5 inches) and a length of about 0.3175 cm (0.125 inches). The spacing between adjacent projections 88 is about 5.874 cm (2.313 inches). The spacing between the outermost projections 88 and the lengthwise ends of the manifold 26 is about 6.588 cm (2.594 inches).

The manifold first portion 84 has a height of about 2.223 cm (0.875 inches), a width of about 1.905 cm (0.75 inches), and a length of about 36.67 cm (14.44 inches). The manifold second portion 86 has a height of about 1.588 cm (0.625 inches), a width of about 1.905 cm (0.75 inches), and a length of about 30.32 cm (11.94 inches). In other embodiments, the skilled artisan will recognize that the supply rail 76, the channels 78, projections 88, the manifold first portion 84, and the manifold second portion 86 may be dimensioned and configured in a wide variety of manners, as required or desired.

Diffuser Assembly Process

The process of forming the diffuser 20 includes providing the plenum plate 22 and the slitted plate 24. The cross walls 56, the end walls 58, the side walls 60 and the base plate 62 are created to form the plenums 54. A plurality of openings 64 are created in the base plate 62 to form the plenum plate 22.

The plenum plate 22 is fabricated by machining a sheet of material. In another embodiment, the plenum plate 22 is fabricated by laser cutting. In other embodiments, as the skilled artisan will recognize, the plenum plate 22 can be fabricated by a wide variety of other methods, for example, molding, casting and forging, among others.

A plurality of slits 68 flanked by side rails 70 is created to form the slitted plate 24. The slits 68 are arranged in a staggered pattern 72. In one embodiment, the staggered pattern 72 includes a plurality of rows 74 of slits 68. In one embodiment, each row 74 of slits 68 includes a plurality of slits 68.

The slitted plate 24 is fabricated by machining a sheet of material. In another embodiment, the slitted plate 24 is fabricated by laser cutting. In other embodiments, as the skilled artisan will recognize, the slitted plate 24 can be fabricated by a wide variety of other methods, for example, molding, casting and forging, among others.

The plenum plate 22 and the slitted plate 24 are attached so that they are aligned with one another, and in mechanical and fluid communication with one another to form the diffuser 20. The plenum plate 22 and the slitted plate 24 are attached by utilizing welding or bonding. In one embodiment, each plenum 54 is in fluid communication with ten rows 74 of slits 68.

In one embodiment, the diffuser 20 is mounted in the wet processing system 10 (FIG. 1) to provide generally uniform and/or laminar flow across the wafers 32. In another embodiment, the diffuser 20 is mounted in the wet processing system 110 (FIG. 2) to provide generally uniform and/or laminar flow across the wafers 32.

Operation

In one embodiment, and referring to FIG. 1, the pressurized liquid diffuser 20 provides a generally uniform and/or laminar flow 38 over the wafers 32 in the wet processing system 10. As indicated above, the fluid 30 enters the inner tank 14 via inlet feed line 36. The fluid 30 then flows through the manifolds 26, the plenum plate 22, the slitted plate 24 and in a generally upwards direction over the wafers 32. The fluid 30 flows over the upper rim 40 of the inner tank 14 and into the outer tank 12. The fluid 30 exits the wet processing system 10 via the outlet feed line 48. In one embodiment, each row 74 of slits 68 is associated with a respective one of the wafers 32, to provide fluid 30 for wafer processing.

Referring to FIG. 1, the generally uniform and/or laminar flow 38 over the wafers 32 is achieved, at least partially, due to the pressurizing of the fluid 30 within the plenum plate 22, and hence the generation of substantially large local pressure drops through the slitted plate 24. Pressurized fluid 30 from the plenum plate 22 is forced through the slitted plate 24, and emanates in a generally uniform and/or laminar flow 38. In one embodiment, the slits 68 (see, for example, FIG. 9) of the slitted plate 24 are configured such that the open area provided by the slits 68 is approximately equal to the inlet flow area provided by the inlet feed line 36. Thus, a balance is achieved between the inlet average velocity through the inlet feed line 36 and the average velocity through the slitted plate 24 (or diffuser 20). In other embodiments, the inlet average velocity through the inlet feed line 36 can be less or more than the average velocity through the slitted plate 24 (or diffuser 20), as required or desired, giving due consideration to the goals of providing generally uniform and/or laminar flow.

In another embodiment, and referring to FIG. 2, the pressurized liquid diffuser 20 provides a generally uniform and/or laminar flow 138 over the wafers 32 in the wet processing system 110. As indicated above, fluid 30 from the inlet feed line 36 enters the manifolds 26. The fluid 30 then flows through the plenum plate 22, the slitted plate 24 and in a generally downwards direction over the wafers 32. The fluid 30 exits the wet processing system 110 via the outlet feed line 48. In one embodiment, each row 74 of slits 68 is associated with a respective one of the wafers 32, to provide fluid 30 for wafer processing.

Referring to FIG. 2, the generally uniform and/or laminar flow 138 over the wafers 32 is achieved, at least partially, due to the pressurizing of the fluid 30 within the plenum plate 22, and hence the generation of substantially large local pressure drops through the slitted plate 24. Pressurized fluid 30 from the plenum plate 22 is forced through the slitted plate 24, and emanates in a generally uniform and/or laminar flow 38. In one embodiment, the slits 68 (see, for example, FIG. 9) of the slitted plate 24 are configured such that the open area provided by the slits 68 is approximately equal to the inlet flow area provided by the inlet feed line 36. Thus, a balance is achieved between the inlet average velocity through the inlet feed line 36 and the average velocity through the slitted plate 24 (or diffuser 20). In other embodiments, the inlet average velocity through the inlet feed line 36 can be less or more than the average velocity through the slitted plate 24 (or diffuser 20), as required or desired, giving due consideration to the goals of providing generally uniform and/or laminar flow.

The pressurized liquid diffuser 20 (see, for example, FIG. 4) demonstrates certain advantages over conventional wet processing of wafers. One advantage is that by "diffusing" the fluid 30 (FIGS. 1 and 2) through the slits 68 a generally uniform and/or laminar flow is provided across the wafers 32 and the system tank, such as the inner tank 14 (FIG. 1) and the tank 13 (FIG. 2). Desirably, this results in more reliable and repeatable wet processing of wafers 32, for example, by providing improved, cleaner etches and rinses. Additionally, the fluid 30 contacts much or all the active wafer surface (FIGS. 1 and 2) generally evenly.

While the components and techniques of the present invention have been described with a certain degree of particularity, it is manifest that many changes may be made in the specific designs, constructions and methodology hereinabove described without departing from the spirit and scope of this disclosure. It should be understood that the invention is not limited to the embodiments set forth herein for purposes of exemplification, but is to be defined only by a fair reading of the appended claims, including the full range of equivalency to which each element thereof is entitled.

What is claimed is:

1. A method for diffusing fluid through a wafer processing system, comprising:
   pressurizing fluid; and
   forcing the fluid through a plate having a plurality of slits arranged in rows with a plurality of the rows having at least one central slit, the central slits of at least two rows having different lengths.

2. The method of claim 1, wherein the act of forcing the fluid, forces fluid through two adjacent rows with central slits of different lengths.

3. The method of claim 2, wherein the act of pressurizing fluid comprises the act of pressurizing fluid in a plurality of plenums in fluid communication with the plate.

4. The method of claim 1, wherein the act of forcing the fluid improves the uniformity of the flow pattern.

5. The method of claim 4, wherein the act of pressurizing fluid comprises the act of pressurizing fluid in five plenums in fluid communication with the plate.

6. The method of claim 1, wherein the act of pressurizing fluid comprises the act of pressurizing fluid in at least one plenum in fluid communication with the plate.

7. The method of claim 1, wherein the act of forcing the fluid comprises the act of generating substantially large local pressure drops through the slits.

8. The method of claim 1, wherein the method further comprises the act of supplying fluid to the plate through a manifold.

9. A method for wet processing of wafers, comprising:
supporting one or more wafers in a tank; and
diffusing pressurized fluid through a plate having a plurality of slits arranged in rows with a plurality of the rows having at least one central slit, the central slits of at least two rows having different lengths, whereby the fluid flows across the one or more wafers.

10. The method of claim 9, wherein the act of diffusing pressurized fluid forces fluid through adjacent rows with central slits of different lengths.

11. The method of claim 9, wherein the act of diffusing pressurized fluid through the plate generates a generally laminar flow across the one or more wafers.

12. The method of claim 9, wherein the act of supporting one or more wafers comprises the act of supporting one or more wafers in a wafer carrier.

13. The method of claim 9, wherein the act of supporting one or more wafers comprises the act of supporting one or more wafers substantially stationarily.

14. The method of claim 9, wherein the act of supporting one or more wafers comprises the act of positioning the wafers with their flat sides vertically oriented and spaced in generally parallel aligned relation.

15. The method of claim 9, wherein the act of supporting one or more wafers comprises the act of supporting fifty wafers.

16. The method of claim 9, wherein the act of diffusing pressurized fluid comprises the act of forcing the fluid through the slits in to the tank.

17. A method for diffusing fluid through a wafer processing system, comprising:
pressurizing fluid; and
forcing the fluid through a plate having a plurality of slits arranged in rows with a plurality of the rows having at least one end slit wherein at least two of the rows have end slits of different lengths.

18. The method of claim 17, wherein the act of forcing the fluid, forces the fluid through adjacent rows with end slits of different lengths.

19. The method of claim 17, wherein the act of forcing the fluid generates a generally uniform flow pattern.

20. The method of claim 17, wherein the act of forcing the fluid comprises the act of forcing the fluid through a plurality of the slits arranged in a staggered pattern.

21. The method of claim 17, wherein the act of forcing the fluid comprises the act of forcing the fluid through a plurality of the rows arranged in a repetitive alternating pattern.

22. The method of claim 17, wherein the act of forcing the fluid comprises the act of forcing the fluid through at least one row having a slit pattern comprising a longer central slit between two shorter end slits.

23. The method of claim 17, wherein the act of forcing the fluid comprises the act of forcing the fluid through at least one row having a slit pattern comprising a shorter central slit between two longer end slits.

24. The method of claim 17, wherein the act of forcing the fluid comprises the act of forcing the fluid through a plurality of the rows which form a pattern with rows having a shorter central slit between two longer end slits being neighbored by rows having a longer central slit between two shorter end slits.

25. A method for wet processing of wafers, comprising:
supporting one or more wafers in a tank; and
diffusing pressurized fluid through a plate having a plurality of slits arranged in rows with a plurality of the rows having at least one end slit, wherein at least two rows have end slits of different lengths.

26. The method of claim 25, wherein the act of diffusing pressurized fluid, forces fluid through two adjacent rows with end slits of different lengths.

27. The method of claim 25, wherein the act of diffusing pressurized fluid improves the laminar flow across the one or more wafers.

28. The method of claim 25, wherein the act of supporting one or more wafers comprises the act of positioning the wafers substantially parallel to the slits.

29. The method of claim 25, wherein the act of supporting one or more wafers comprises the act of positioning the wafers substantially parallel to the rows.

30. The method of claim 25, wherein the act of supporting one or more wafers comprises the act of positioning at least one of the wafers between a pair of neighboring rows.

31. The method of claim 25, wherein the act of supporting one or more wafers comprises the act of positioning the wafers below the plate.

32. The method of claim 25, wherein the act of supporting one or more wafers comprises the act of positioning the wafers above the plate.

33. A method of diffusing fluid through a wet semiconductor processing system comprising forcing fluid through a plate having a plurality of slots arranged in rows with a plurality of the rows having at least one central slot, the central slots of at least two rows having different lengths.

34. The method of claim 33 wherein the act of forcing fluid, forces fluid through two adjacent rows with central slots of different lengths.

35. The method of claim 33, wherein the act of forcing fluid comprises the act of generating local pressure drops through the slots.

36. The method of claim 33, wherein the act of forcing fluid comprises the act of forcing fluid through a plurality of the rows arranged in a repetitive pattern.

37. The method of claim 33, wherein the act of forcing fluid comprises the act of forcing fluid through a plurality of the rows arranged in an alternating pattern.

38. The method of claim 33, wherein the act of forcing fluid comprises the act of forcing fluid through at least one row having a slot pattern comprising a longer central slot between two shorter end slots.

39. The method of claim 33, wherein the act of forcing fluid comprises the act of forcing fluid through at least one row having a slot pattern comprising a shorter central slot between two longer end slots.

40. The method of claim 33, wherein the act of forcing fluid comprises the act of forcing fluid through a plurality of the rows which form a pattern with rows having a shorter central slot between two longer end slots being neighbored by rows having a longer central slot between two shorter end slots.

41. The method of claim 33, wherein the method further comprises the act of controlling the temperature of the fluid.

42. A method for wet processing of wafers comprising diffusing pressurized fluid through a plate having a plurality of slots arranged in rows with a plurality of the rows having at least one end slot, the end slots of at least two rows having different lengths.

43. The method of claim 42, wherein the act of diffusing pressurized fluid comprises the act of forcing fluid through the slots.

44. The method of claim 43, wherein the act of forcing fluid comprises the act of generating local pressure drops across the plate.

45. The method of claim 42, wherein the act of diffusing pressurized fluid forces fluid through two adjacent rows with end slots of different lengths.

46. The method of claim 42, wherein the act of diffusing pressurized fluid comprises the act of forcing fluid through a plurality of the slots arranged in a staggered pattern.

47. The method of claim 42, wherein the act of diffusing pressurized fluid comprises the act of forcing fluid through a plurality of the rows arranged in an alternating repetitive pattern.

48. The method of claim 42, wherein the act of diffusing pressurized fluid comprises the act of forcing fluid through a plurality of the rows having a slot pattern comprising a longer central slot between two shorter end slots.

49. The method of claim 42, wherein the act of diffusing pressurized fluid comprises the act of forcing fluid through a plurality of the rows having a slot pattern comprising a shorter central slot between two longer end slots.

50. The method of claim 42, wherein the act of diffusing pressurized fluid comprises the act of forcing fluid through a plurality of the rows having a pattern with rows having a shorter central slot between two longer end slots being neighbored by rows having a longer central slot between two shorter end slots.

51. The method of claim 42, wherein the method further comprises the act of supplying fluid to the plate through a manifold positioned upstream of the plate.

52. The method of claim 51, wherein the method further comprises the act of supplying fluid to the manifold from a pump positioned upstream of the manifold.

53. The method of claim 52, wherein the act of supplying fluid comprises the act of supplying fluid at a flow rate of about 20 liters/min.

* * * * *